United States Patent [19]
Ishihara et al.

[11] Patent Number: 6,087,272
[45] Date of Patent: Jul. 11, 2000

[54] METHOD OF PRODUCING THIN FILM TRANSISTOR

[75] Inventors: Tomoaki Ishihara; Kazunori Kobayashi, both of Toyama; Toshihide Nobusada, Osaka, all of Japan

[73] Assignee: Matsushita Electronics Corporation, Osaka, Japan

[21] Appl. No.: 09/251,290

[22] Filed: Feb. 17, 1999

[30] Foreign Application Priority Data

Feb. 17, 1998 [JP] Japan ................................. 10-034492

[51] Int. Cl.[7] ....................................... H01L 21/00
[52] U.S. Cl. ............................ 438/754; 216/23; 438/745
[58] Field of Search ............................ 438/30, 609, 653, 438/683, 745, 754, 756, 755; 216/18, 23, 33, 38, 41; 349/43, 46

[56] References Cited

U.S. PATENT DOCUMENTS 5,938,942  8/1999  Yamazaki et al. .................. 216/23
6,001,539  12/1999  Lyu et al. .

*Primary Examiner*—William Powell
*Attorney, Agent, or Firm*—Ratner & Prestia

[57] ABSTRACT

On the surface of an insulating substrate 1 on which a transistor is formed, a first interlayer insulation film 8 is provided, and a first contact hole 9 and a metal interconnection layer 10 are formed. A second interlayer insulation film 11 is formed covering the above items, and a second contact hole 12 and a barrier metal 13 are formed. After a first hole 14 for bonding pad is formed, a third interlayer insulation film 15 is provided, and then a third contact hole 16 and a second hole 17 for bonding pad are formed. A transparent electro-conductive film 18 is formed covering the holes 14, 16 and 17. After that, a portion of the transparent electro-conductive film 18 locating above the holes 14, 17 for bonding pad is removed to have the metal interconnection layer 10 exposed. The exposed metal interconnection layer 10 is used as bonding pad 20. This contributes to reliable bonding of bonding wires onto the bonding pad.

4 Claims, 2 Drawing Sheets

METHOD OF PRODUCING THIN FILM TRANSISTOR

FIELD OF THE INVENTION

The present invention relates to a method of manufacturing a thin film transistor (TFT) to be used in a liquid crystal display device or other such devices.

BACKGROUND OF THE INVENTION

There has been a technology of forming a thin film transistor on a large area of an insulating substrate by using an amorphous silicon thin film or a polycrystalline silicon thin film. The thin film transistor is used in an active matrix type liquid crystal display device as the switching element for selecting a pixel electrode. Furthermore, a liquid crystal display device comprising a transistor array is also being introduced to the market; in which display device a driving circuit, among the peripheral circuits, consisted of polycrystalline silicon thin film transistors is incorporated besides the switching element made of thin film transistor.

A conventional method of manufacturing the thin film transistor is described below with reference to FIG. 2(a) through FIG. 2(f), which show the manufacturing process flow. As shown in FIG. 2(a), an amorphous silicon thin film, a polycrystalline silicon thin film or a single crystal silicon thin film (hereinafter these silicon thin films are referred to simply as silicon thin film) is formed on an insulating substrate 1, and an island region 2 for transistor is shaped using a resist pattern. On the surface of the island region 2, a gate insulation film 3 is formed, as shown in FIG. 2(b), and a gate electrode 4 is formed selectively thereon. As shown in FIG. 2(c), impurities ion 5 is implanted using the gate electrode 4 as mask to form a source region 6 and a drain region 7 in the island region 2 in a self-aligning manner.

As shown in FIG. 2(d), a first interlayer insulation film 8 is formed on the whole surface, and then first contact holes 9 are perforated through the first interlayer insulation film 8 and the gate insulation film 3 reaching, respectively, the source region 6 and the drain region 7. A metal film of silicon-containing aluminum or other material is deposited covering the whole surface of the first interlayer insulation film 8, which metal film is then patterned to form a metal interconnection layer 10 using a photo etching process.

As shown in FIG. 2(e), a second interlayer insulation film 11 is formed on the whole surface, and then a second contact hole 12 is perforated through the second interlayer insulation film 11 reaching the metal interconnection layer 10. A barrier metal 13 of a tungsten suicide or other such material is formed selectively on the second interlayer insulation film 11 including the second contact hole 12. In order to form a bonding pad, a first hole 14 for bonding pad is perforated through the second interlayer insulation film 11 reaching the metal interconnection layer 10.

As shown in FIG. 2(f), a third interlayer insulation film 15 is formed on the whole surface, and then a third contact hole 16 is perforated through the third interlayer insulation film 15 reaching the barrier metal 13, and a second hole 17 for bonding pad is formed in connection with the first hole 14 for bonding pad. A transparent electro-conductive film of ITO (Indium Tin Oxide) or the like is provided by deposition covering the whole surface. A photo-resist film is applied thereon, and etching is performed using the photo-resist film patterned selectively on a region of the first and the second holes 14, 17 for bonding pad and a region on the third interlayer insulation film 15 including the third contact hole 16. Etchant for etching the transparent electro-conductive film is made from a strong acid halogenide of hydrochloric acid group or iodic acid group. A transparent pixel electrode 18 and a bonding pad 19 are formed through the above-described procedure.

In the above-described conventional manufacturing method, the bonding pad 19 has been formed with a transparent electro-conductive film. Bonding of thin gold wire or other wires to the bonding pad 19 is not easy, as compared with a case where the bonding pad 19 is formed with aluminum film or a film of other metal.

Furthermore, when measuring the characteristics of a transistor by contacting a probe on bonding pad, the conventional bonding pad formed of a transparent electro-conductive film results in the measurement results of inferior accuracy because the contact resistance between a probe and the transparent electro-conductive film is higher as compared with a case where the latter is made of aluminum.

SUMMARY OF THE INVENTION

The present invention aims to present a method of manufacturing a thin film transistor, wherein a bonding wire is surely bonded on a bonding pad and the measurement of transistor characteristics is easy.

The invented method comprises the steps of forming a transistor on an insulating substrate, forming a first interlayer insulation film covering the transistor, forming a first contact hole through the first interlayer insulation film, forming a metal film for metal interconnection selectively on an area of the first interlayer insulation film including the first contact hole, forming a second interlayer insulation film on the first interlayer insulation film, forming a second contact hole in the second interlayer insulation film at an area above the metal film, forming a barrier metal selectively on the second interlayer insulation film including the second contact hole, forming a first hole for bonding pad, after the barrier metal being formed, in the second interlayer insulation film at an area above the metal film, forming a third interlayer insulation film on the second interlayer insulation film, forming a third contact hole in the third interlayer insulation film at an area above the barrier metal, forming a second hole for bonding pad in the third interlayer insulation film which hole being connected with the first hole for bonding pad, forming a transparent electro-conductive film by deposition on the third interlayer insulation film including the second hole for bonding pad, applying a photo-resist film on the transparent electro-conductive film, removing the photo-resist film locating on the first and the second holes for bonding pad and retaining a resist pattern selectively on the third interlayer insulation film including the third contact hole, and etching the transparent electro-conductive film, after the resist pattern being formed, so as to form a transparent pixel electrode. In accordance with the above-described manufacturing process, a bonding pad can be formed with a metal film. Therefore, the bonding wires may be surely bonded on the bonding pad, and the probe test may be conducted in a manner in which the test results of high accuracy level are obtainable.

In the invented method of manufacturing a thin film transistor, it is preferred to use an organic reducing agent as the etchant for etching the transparent electro-conductive film. This prevents the metal film, which is locating underneath the transparent electro-conductive film, from being etched during etching of the transparent electro-conductive film covering the surface of hole for bonding pad.

It is also preferred to form the transparent electro-conductive film in amorphous state, by adding hydrogen during deposition of the transparent electro-conductive film. By so doing, there may be no residual indium after etching of the ITO or other transparent electro-conductive film with an organic reducing agent.

DESCRIPTION OF THE PREFERRED EMBODIMENTS

A preferred embodiment of the present invention is described below with reference to the drawings FIG. 1(a) through FIG. 1(f).

Figure 1A:
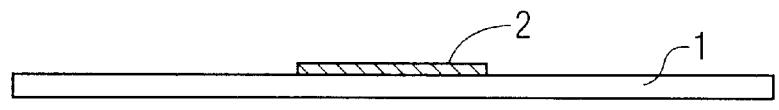
FIG. 1(a) through FIG. 1(f) are cross sectional views showing the process of manufacturing a thin film transistor in accordance with an embodiment of the present invention.
Figure 1B:
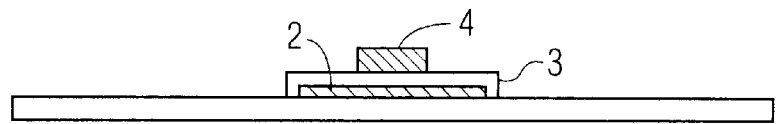
Figure 1C:
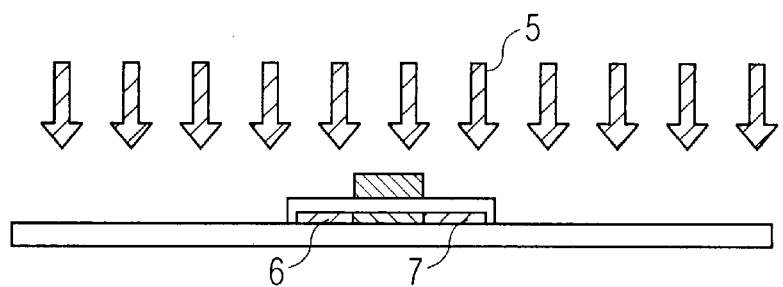

As shown in FIG. 1(a), a silicon thin film (an amorphous silicon thin film, a polycrystalline silicon thin film or a single crystal silicon thin film) is formed on an insulating substrate 1 made of quartz glass or other such material, and an island region 2 of silicon thin film is formed in an area for transistor by a photo etching method using a resist pattern. On the surface of the island region 2, a gate insulation film 3 is formed, as shown in FIG. 1(b), and a gate electrode 4 is formed selectively thereon. As shown in FIG. 1(c), impurities ion 5 is implanted using the gate electrode 4 as mask to form a source region 6 and a drain region 7 in the island region 2 in a self-aligning manner.

Figure 1D:
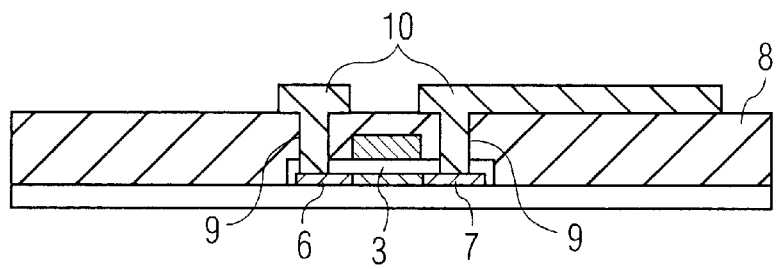

As shown in FIG. 1(d), a first interlayer insulation film 8 of silicon oxide film is formed on the whole surface, and then first contact holes 9 are perforated through the first interlayer insulation film 8 and the gate insulation film 3 reaching, respectively, the source region 6 and the drain region 7. A metal film of silicon-containing aluminum or other material is deposited covering the whole surface, which metal film is patterned to form a metal interconnection layer 10 by a photo etching process.

Figure 1E:
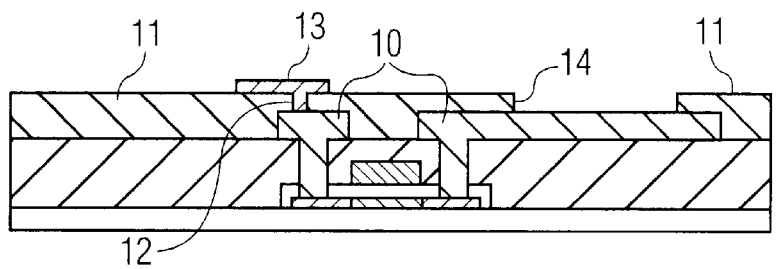

As shown in FIG. 1(e), a second interlayer insulation film 11 of silicon oxide film is formed on the whole surface, and then a second contact hole 12 is perforated through the second interlayer insulation film 11 reaching the metal interconnection layer 10. A barrier metal 13 of a tungsten silicide or other such material is formed selectively on the second interlayer insulation film 11 including the second contact hole 12. In order to form a bonding pad, a first hole 14 for bonding pad is perforated through the second interlayer insulation film 11 reaching the metal interconnection layer 10.

Figure 1F:
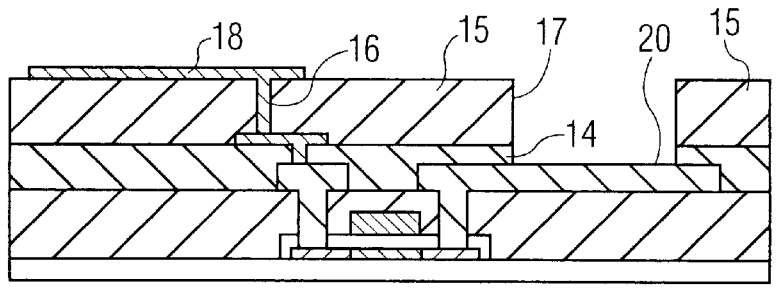
Figure 2A:
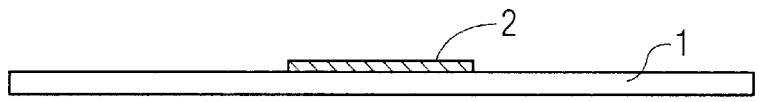
FIG. 2(a) through FIG. 2(f) are cross sectional views showing a conventional process of manufacturing a thin film transistor.
Figure 2B:
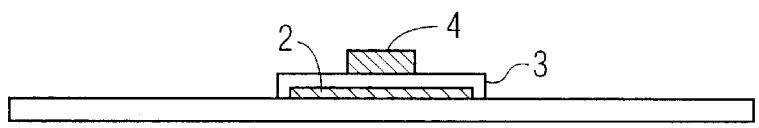
Figure 2C:
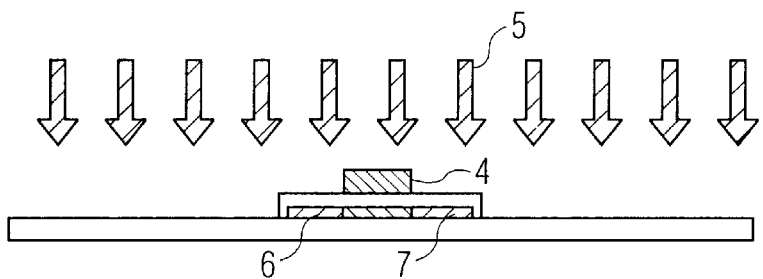
Figure 2D:
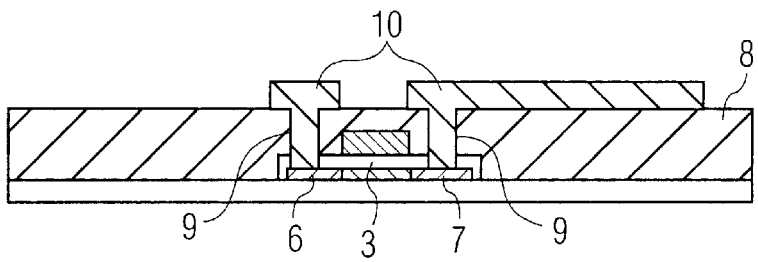
Figure 2E:
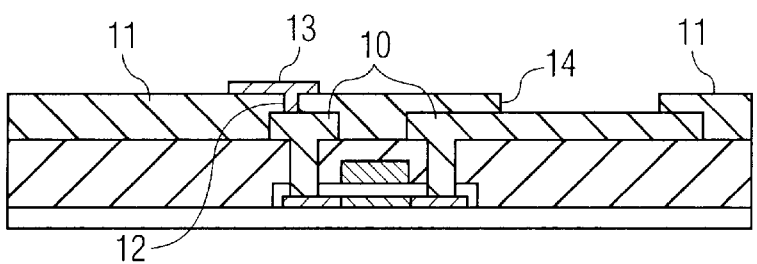
Figure 2F:
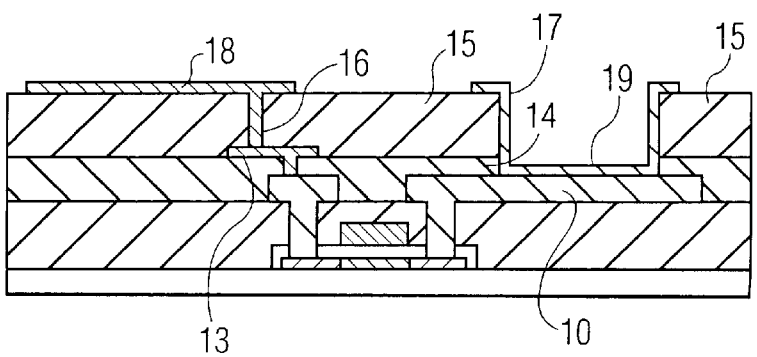

As shown in FIG. 1(f), a third interlayer insulation film 15 of silicon oxide film is formed on the whole surface, and then a third contact hole 16 is perforated through the third interlayer insulation film 15 reaching the barrier metal 13, and a second hole 17 for bonding pad is formed connecting with the first hole 14 for bonding pad. Now, the interconnection metal layer 10 is seen exposed at the bottom of the hole shaped by the first and the second holes 14, 17 for bonding pad.

A transparent electro-conductive film of ITO or the like is provided by deposition covering the whole surface, and a photo-resist is applied thereon. The photo-resist in the region of holes 14, 17 for bonding pad is removed, and a resist pattern is shaped selectively on a region of the third interlayer insulation film 15 including the third contact hole 16. Etching is conducted using the etchant for transparent electro-conductive film. In this way, a transparent pixel electrode 18 made of transparent electro-conductive film is formed. Meanwhile, a bonding pad 20, with which the transparent electro-conductive film is etched off and the metal interconnection layer 10 is being exposed, is provided at the bottom of the holes 14, 17.

If the conventional strong acid halogenide of hydrochloric acid group or iodic acid group is used as etchant for etching the transparent electro-conductive film, the metal film 10 of silicon-containing aluminum or the like disposed underneath the transparent electro-conductive film at the bottom of the holes 14, 17 may also be etched in succession. Therefore, it is preferred to use oxalic acid $(COOH)_2$ or the like, which being an organic reducing agent that etches the transparent electro-conductive film but does not etch the metal film of aluminum. The above etchant removes the transparent electro-conductive film in the bonding pad region 14, 17, but it does not attack the metal film 10 disposed underneath. This means that the thickness of metal film 10 which functions as the bonding pad 20 is not reduced, and the connection with bonding wire is not weakened.

When oxalic acid $(COOH)_2$, or an organic reducing agent, is used as etchant for removing the transparent electro-conductive film, an indium content constituting the transparent electro-conductive film of ITO, etc. easily remains. In order to prevent this to occur, the transparent electro-conductive film may be formed in amorphous state by adding hydrogen when depositing the transparent electro-conductive film. By so doing, the indium content does not remain even when the transparent electro-conductive film is etched off by using the organic reducing agent, oxalic acid $(COOH)_2$.

What is claimed is:

1. A method of manufacturing a thin film transistor comprising the steps of:

forming a transistor on an insulating substrate by selectively forming a silicon thin film, a gate insulation film and a gate electrode, one after the other, with a source region and a drain region being formed respectively in said silicon thin film;

forming a first interlayer insulation film covering the surface of said insulating substrate including said transistor;

perforating a first contact hole in said first interlayer insulation film;

forming a metal interconnection by selectively forming a metal film on a surface area of said first interlayer insulation film including said first contact hole;

forming a second interlayer insulation film on the surface of said first interlayer insulation film;

perforating a second contact hole in said second interlayer insulation film at an area above said metal film;

forming a barrier metal selectively on the surface of said second interlayer insulation film including said second contact hole;

perforating a first hole for bonding pad, after said barrier metal is formed, in said second interlayer insulation film at an area above said metal film;

forming a third interlayer insulation film on the surface of said second interlayer insulation film;

perforating a third contact hole in said third interlayer insulation film at an area above said barrier metal;

perforating a second hole for bonding pad in said third interlayer insulation film, which hole being connected with said first hole for bonding pad;

forming a transparent electro-conductive film by deposition on the surface of said third interlayer insulation film including said second hole for bonding pad;

applying a photo-resist film on the surface of said transparent electro-conductive film;

removing said photo-resist film locating on said first and second holes for bonding pad, and retaining a resist pattern selectively on the surface of said third interlayer insulation film including said third contact hole; and etching said transparent electro-conductive film, after said resist pattern is formed, so as to form a transparent pixel electrode.

2. The method of manufacturing a thin film transistor recited in claim 1, wherein the etchant used in said etching process is an etching liquid made from an organic reducing agent.

3. The method of manufacturing a thin film transistor recited in claim 1, wherein hydrogen is provided during formation of said transparent electro-conductive film for forming said transparent electro-conductive film in amorphous state.

4. The method of manufacturing a thin film transistor recited in claim 2, wherein hydrogen is provided during formation of said transparent electro-conductive film for forming said transparent electro-conductive film in amorphous state.

* * * * *